(12) United States Patent
Kang (10) Patent No.: US 9,186,910 B2
(45) Date of Patent: Nov. 17, 2015

(54) PRINTING APPARATUS

(71) Applicant: Samsung Display Co., Ltd., Yongin, Gyeonggi-Do (KR)

(72) Inventor: Yoon-Ho Kang, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 52 days.

(21) Appl. No.: 13/927,335

(22) Filed: Jun. 26, 2013

(65) Prior Publication Data

US 2014/0198149 A1     Jul. 17, 2014

(30) Foreign Application Priority Data

Jan. 17, 2013    (KR) .......................... 10-2013-0005501

(51) Int. Cl.
| | |
|---|---|
| B05C 11/00 | (2006.01) |
| B41J 3/28 | (2006.01) |
| B41J 3/407 | (2006.01) |
| B41J 11/06 | (2006.01) |
| H01L 51/00 | (2006.01) |

(52) U.S. Cl.
CPC .. *B41J 3/28* (2013.01); *B41J 3/407* (2013.01); *B41J 11/06* (2013.01); *H01L 51/0005* (2013.01)

(58) Field of Classification Search
CPC .................................................. H01L 51/0005
USPC ........ 118/313–315, 305, 712, 713; 347/8, 19, 347/40
See application file for complete search history.

(56) References Cited

U.S. PATENT DOCUMENTS

| | | | |
|---|---|---|---|
| 6,419,746 B1 * | 7/2002 | Banno et al. ................... | 118/323 |
| 7,556,690 B2 * | 7/2009 | Goto .............................. | 118/323 |
| 2006/0039735 A1 * | 2/2006 | Oh et al. ........................ | 400/320 |
| 2007/0109487 A1 * | 5/2007 | Lee et al. ....................... | 349/187 |
| 2009/0101064 A1 * | 4/2009 | Naka et al. .................... | 118/313 |
| 2009/0201325 A1 * | 8/2009 | Ready et al. ...................... | 347/8 |

FOREIGN PATENT DOCUMENTS

| | | |
|---|---|---|
| KR | 10-2011-0020111 | 3/2011 |
| KR | 10-2012-0058875 | 6/2012 |

\* cited by examiner

*Primary Examiner* — Yewebdar Tadesse
(74) *Attorney, Agent, or Firm* — Robert E. Bushnell, Esq.

(57) ABSTRACT

A printing apparatus that recognizes a location of a substrate, which is a printing target, and performs printing. The printing apparatus includes: a stage to which the substrate is mounted; a location recognition unit recognizing a location of the substrate mounted to the stage; and a printing unit disposed in an upper portion of the stage and coating a printing solution on the substrate, and the location recognition unit includes a plurality of alignment marks formed in the substrate and a camera photographing the alignment marks. The plurality of alignment marks are disposed to be rotationally symmetrical to each other with reference to the center of the substrate for the locations of the alignment marks to be the same even though the substrate is rotated by a predetermined angle with reference to the center of the substrate.

20 Claims, 7 Drawing Sheets

PRINTING APPARATUS

CLAIM PRIORITY

This application makes reference to, incorporates the same herein, and claims all benefits accruing under 35 U.S.C. §119 from an application earlier filed in the Korean Intellectual Property Office on 17 Jan. 2013 and there duly assigned Serial No 10-2013-0005501.

BACKGROUND OF THE INVENTION

1. Field of the Invention

The present invention relates to a printing apparatus.

2. Description of the Related Art

In general, an inkjet printing apparatus is used to form a thin pattern formed of several organic materials including an emission layer of an organic light emitting diode (OLED) display, or a color filter and alignment pattern of a liquid crystal display (LCD).

alignment mark alignment mark alignment mark alignment marks

The above information disclosed in this Related Art Section is only for enhancement of understanding of the background of the invention and therefore it may contain information that does not form the prior art that is already known in this country to a person of ordinary skill in the art.

SUMMARY OF THE INVENTION

The present invention has been made in an effort to provide a printing apparatus that can perform printing on a substrate, which may be a printing target, through the same alignment process without regard to an alignment direction of the substrate.

A printing apparatus according to an exemplary embodiment of the present invention provides a printing apparatus that can perform printing with ease by aligning alignment marks formed in a substrate, which may be a printing target, to be rotationally symmetrical to each other with reference to the center of the substrate.

According to one aspect of the present invention, a printing apparatus recognizes a location of a substrate, which may be a printing target, and performs printing. The printing apparatus includes: a stage to which the substrate may be mounted; a location recognition unit recognizing a location of the substrate mounted to the stage; and a printing unit disposed in an upper portion of the stage and coating a printing solution on the substrate, and the location recognition unit includes a plurality of alignment marks formed in the substrate and a camera photographing the alignment marks. The plurality of alignment marks are disposed to be rotationally symmetrical to each other with reference to the center of the substrate for the locations of the alignment marks to be the same even though the substrate may be rotated by a predetermined angle with reference to the center of the substrate.

In this case, the alignment marks may include at least four alignment marks, and the at least four alignment marks may be rotationally symmetrical for every 90 degree angle.

The at least four alignment marks may be disposed in the shape of a square.

Each of the alignment marks may be rotationally symmetric.

The location recognition unit may further include an operation device that recognizes a coordinate of the alignment mark photographed by the camera.

The camera may include at least two cameras.

The at least two cameras may be disposed in a fixed manner so as to correspond to the locations of the alignment marks.

The printing unit may include a printing head dropping the printing solution on the substrate and a moving frame in which the printing head may be provided movable to at least two axis directions.

The moving frame may include a frame member provided movable to a first axis direction in an upper portion of the stage and a moving member provided movable to a second axis direction that may be perpendicular to the first axis direction in the frame member, and the printing head may be provided in one side of the moving member.

The printing apparatus may further include comprising a controller controlling a location of the substrate through information recognized by the location recognition unit.

According to the exemplary embodiment of the present invention, substrate alignment and a printing work can be performed using the same method without regard to an alignment direction of a substrate which may be a printing target.

According to the exemplary embodiment of the present invention, a plurality of alignment marks are disposed rotationally symmetrical to each other with reference to the center of the substrate, which may be a printing target, in the substrate so that the printing work can be simply performed without regard to whether or not the substrate may be rotated.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In order to clarify the present invention, parts that are not connected with the description will be omitted, and the same elements or equivalents are referred to as the same reference numerals throughout the specification. The size and thickness of each element are arbitrarily shown in the drawings, and the present invention is not necessarily limited thereto.

In general, an inkjet printing apparatus may be used to form a thin pattern formed of several organic materials including an emission layer of an organic light emitting diode (OLED) display, or a color filter and alignment pattern of a liquid crystal display (LCD).

When the inkjet printing apparatus is used for the aforementioned purposes, it may include an inkjet head having a nozzle, and ink may be sprayed with a constant volume to a predetermined area on a glass substrate through nozzles of the inkjet head.

For accurate spraying of the ink to the predetermined area on the glass substrate through the nozzles, the glass substrate should be precisely aligned, and for the accurate alignment of the substrate, the inkjet printing apparatus may be provided with a camera for photographing an alignment mark disposed on the substrate.

Figure 8:
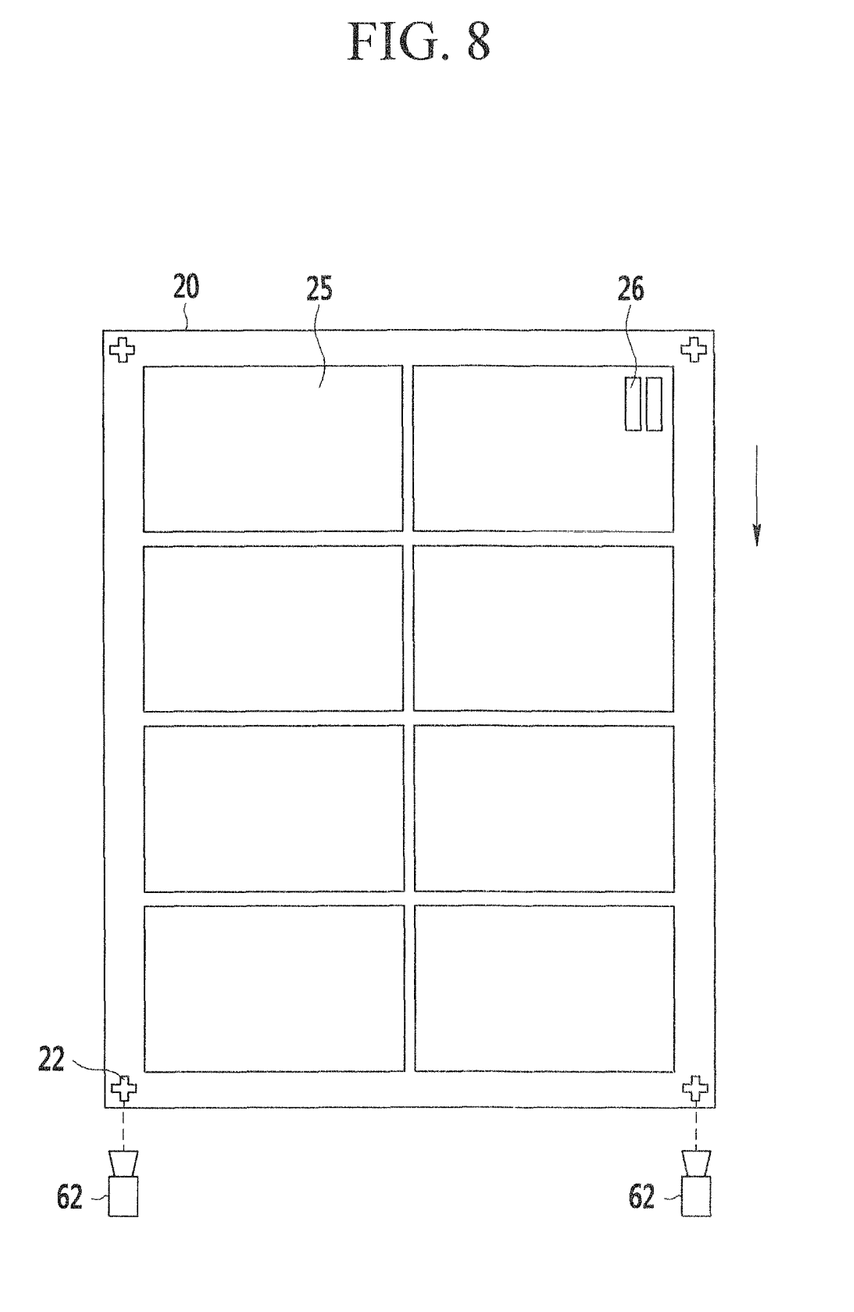
FIG. 8 and FIG. 9 show a substrate in a conventional inkjet printing apparatus.
Figure 9:
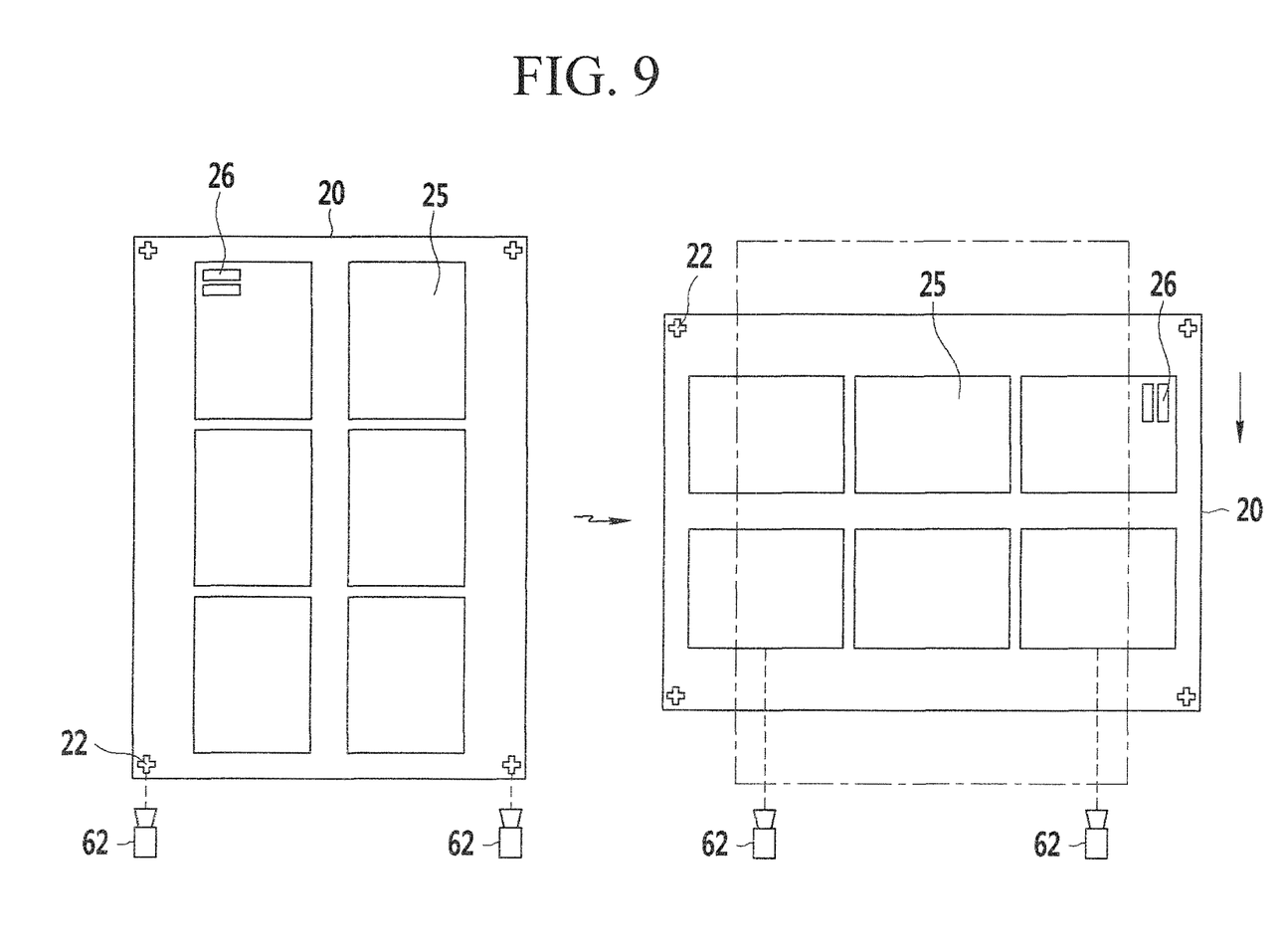

FIG. 8 and FIG. 9 show a substrate in a conventional general inkjet printing apparatus, and are provided for description of an inkjet printing process.

In general, an alignment mark 22 disposed on a substrate 20 may be recognized by a camera 62 and thus the substrate 20 is vertically and horizontally aligned, and then the nozzle may be moved to a direction of a long side of the pattern 26 to be printed, that is, the arrow direction in FIG. 8 to drop an ink solution so as to assure a desired thickness and layer characteristic. In this case, the alignment mark 22 may be disposed in the vicinity of four corners of the substrate 20.

However, as the substrate 20 is increased in size and for improvement of manufacturing efficiency, the number of unit cells 25 per substrate 20 is increased and alignment of the unit cells 25 is varied so that the alignment process of the substrate 20 becomes complicated and much more time is consumed.

For example, unlike the substrate 20 including eight unit cells 25 shown in FIG. 8, prior to the printing process, the alignment process should be performed after the substrate 20 including 6 unit cells 25 shown in FIG. 9 is rotated by 90 degrees with respect to the center of the substrate 20.

This is for performing the printing work that may be performed by dropping ink while moving the nozzle to a predetermined direction, for example, the long side direction of the pattern 26 to be printed, that is, the arrow direction in FIG. 8 (or, the arrow shown in the right side of FIG. 9) in the same printing apparatus.

In this case, referring to FIG. 9, the locations of the alignment marks 22 disposed in the vicinity of the four corners of the substrate 20 are changed due to the rotation of the substrate 20, and therefore the location of the camera 62 should be moved for alignment, and accordingly, a coordinate set value input to the printing apparatus should be changed. That is, the alignment process becomes complicated due to the rotation of the substrate 20.

The present invention relates to a printing apparatus that can simply recognize alignment of a substrate without regard to rotation of a substrate.

Figure 1:
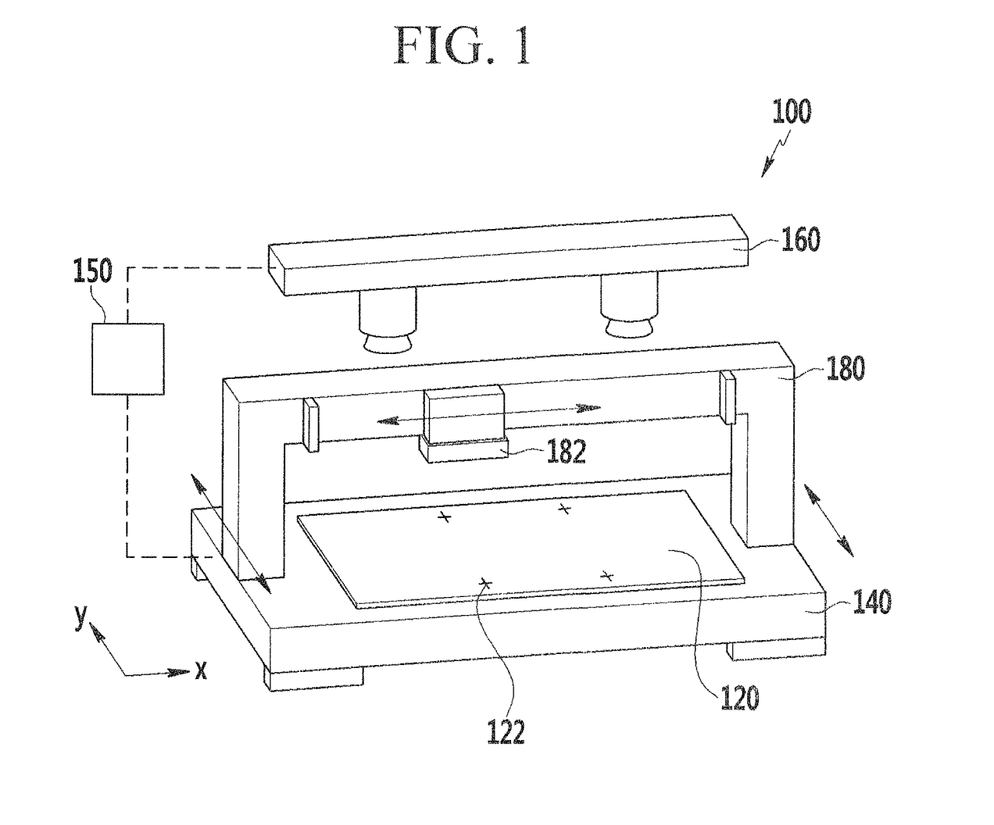
FIG. 1 shows a printing apparatus according to an exemplary embodiment of the present invention.
Figure 2:
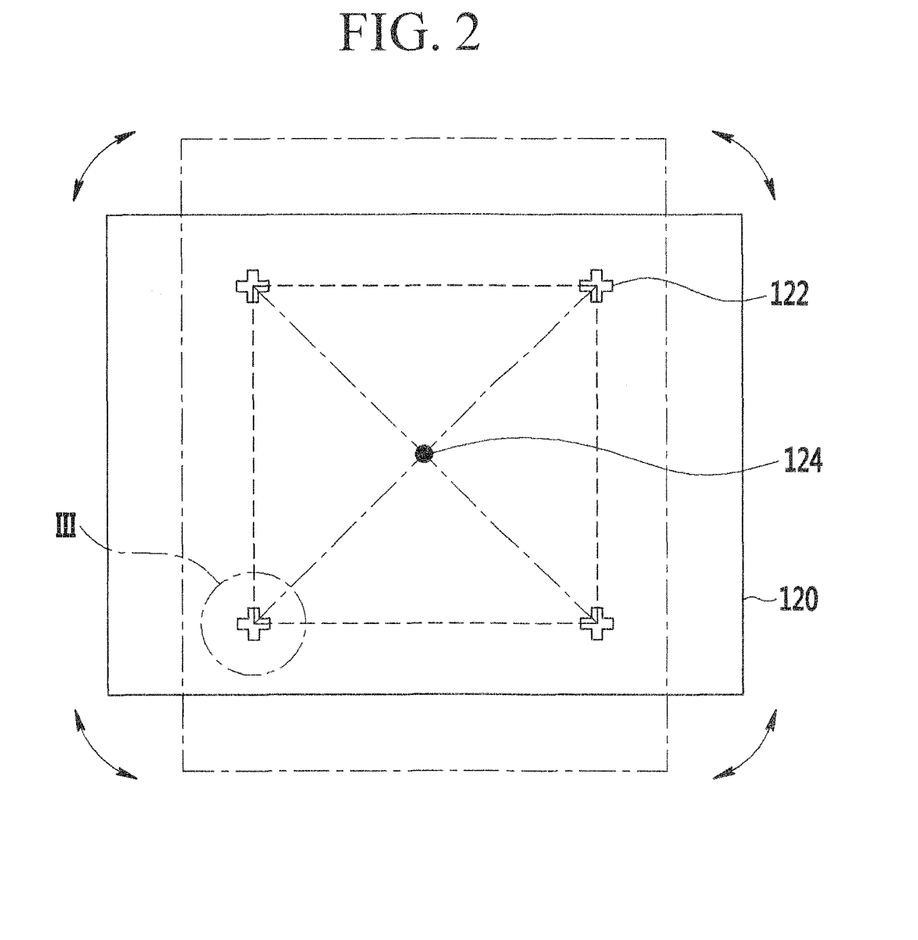
FIG. 2 shows a substrate in the printing apparatus according to the exemplary embodiment of the present invention.
Figure 3:
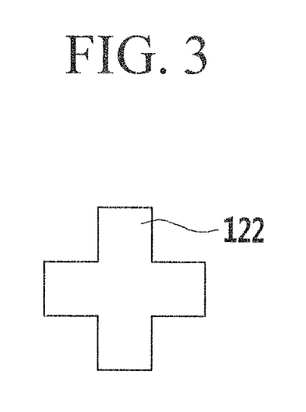
FIG. 3 is an enlarged view of "III" of FIG. 2.
Figure 4:
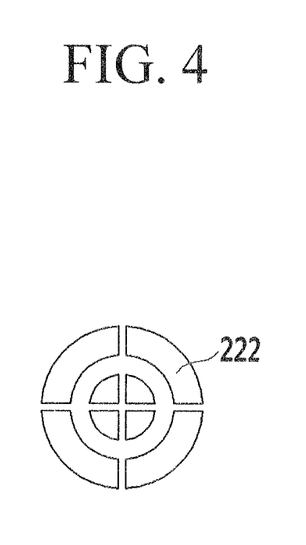
FIG. 4 shows another shape of an alignment mark in the printing apparatus according to the exemplary embodiment of the present invention.
Figure 5:
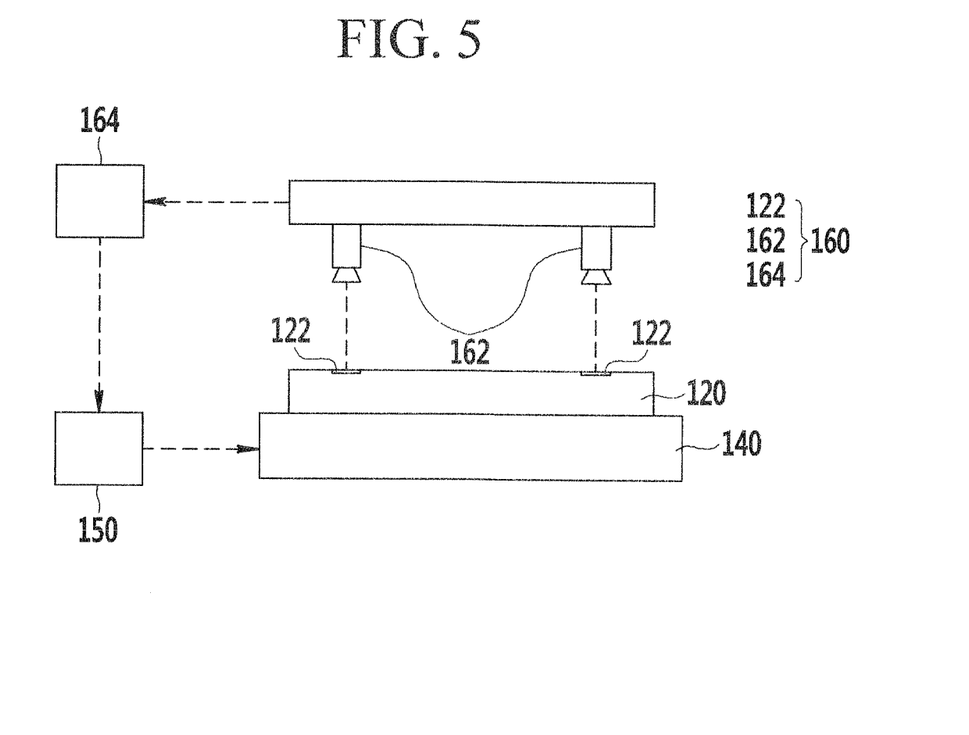
FIG. 5 shows a location recognition unit in the printing apparatus according to the exemplary embodiment of the present invention.
Figure 6:
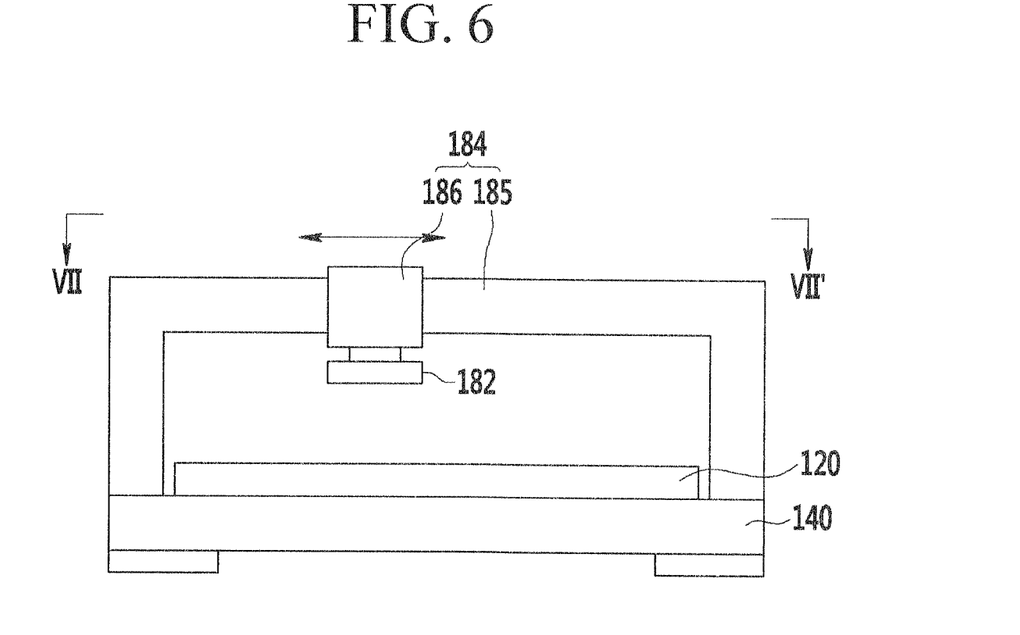
FIG. 6 shows a printing unit in the printing apparatus according to the exemplary embodiment of the present invention.
Figure 7:
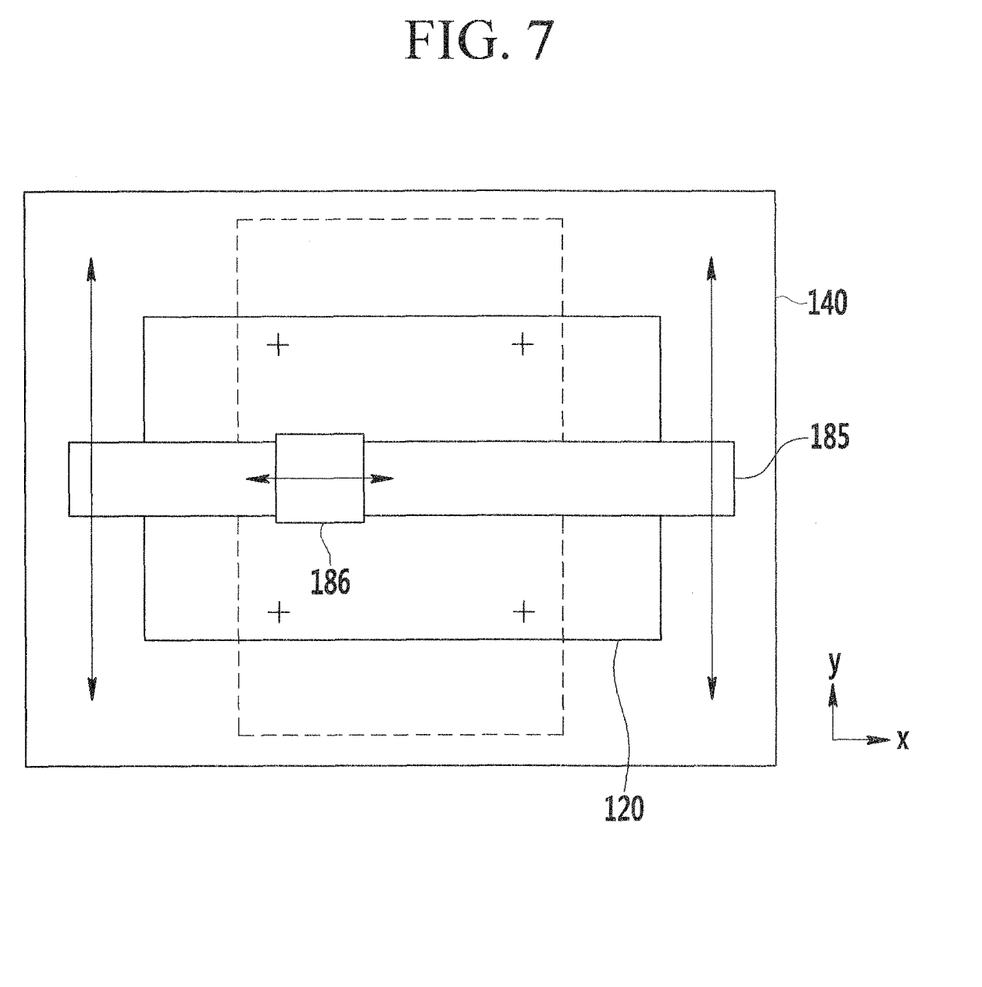
FIG. 7 is an enlarged view of the portion VII-VII' of FIG. 6.

FIG. 1 shows a printing apparatus according to an exemplary embodiment of the present invention. FIG. 2 shows a substrate in the printing apparatus according to the exemplary embodiment of the present invention. FIG. 3 is an enlarged view of "III" of FIG. 2. FIG. 4 shows another shape of an alignment mark in the printing apparatus according to the exemplary embodiment of the present invention. FIG. 5 shows a location recognition unit in the printing apparatus according to the exemplary embodiment of the present invention. FIG. 6 shows a printing unit in the printing apparatus according to the exemplary embodiment of the present invention. FIG. 7 is an enlarged view of the portion VII-VII' of FIG. 6.

Referring to FIG. 1, a printing apparatus 100 according to an exemplary embodiment of the present invention includes an apparatus that recognizes a location of a target for printing, that is, a substrate 120, and performing printing, and includes a stage 140, a location recognition unit 160, a controller 150, and a printing unit 180.

In this case, according to the exemplary embodiment of the present invention, the location recognition unit 160 recognizes an alignment mark 130 of the substrate 120 mounted to the stage 140, aligns the substrate 130 through the controller 150, and performs printing on the substrate 120 of which alignment is completed in the printing unit 180.

Hereinafter, each configuration of the printing apparatus 100 according to the exemplary embodiment of the present invention will be described.

First, the substrate 120 may be a target for printing, and may be formed as a glass substrate.

According to the exemplary embodiment of the present invention, as shown in FIG. 1, the substrate 120 may be formed in the shape of a rectangle, and the alignment marks 122 may be arranged in the vicinity of the respective corners of the substrate 120.

Accordingly, the location recognition unit 160 recognizes locations of the alignment marks 122 to be disposed on the substrate 120 so that a location of the substrate 120 for performing the printing work and alignment of the substrate 120 can be determined.

The configuration related thereto will be described in further detail later.

Meanwhile, the stage 140 may be a constituent element for mounting the substrate 120 thereto.

The stage 140 may be formed in the shape of a plate that may be larger than the substrate 120, and may be provided with a fixing means to fix the substrate 120 mounted to an upper portion thereof.

In this case, according the exemplary embodiment of the present invention, an absorption device (not shown) such as a vacuum chuck may be provided as the fixing means in the stage 140.

In addition, a mechanical control means (not shown) may be provided in one side of the stage 140 to align the fixed substrate 120 on the stage 140.

Thus, the substrate 120 transferred to the printing apparatus 120 by an external transfer means may be moved to a predetermined location on the stage 140 and then fixed on the stage 140 by the fixing means, and the location of the substrate 120 may be controlled by the control means.

As described, the substrate 120 mounted and aligned on the stage 140, the location recognition unit 160 may determine whether the substrate 120 may be located in an accurate location. The location recognition unit 160 will be described in detail hereinafter.

The location recognition unit 160 may be provided to recognize a location of the substrate 120.

Referring to FIG. 5, the location recognition unit 160 may include alignment marks 122 arranged in the substrate 120, a camera 162, and an operation device 164.

The alignment mark 122 may be a mark formed in the substrate 120 for alignment of the substrate 120, and may be provided in plural according to the exemplary embodiment of the present invention.

In this case, as shown in FIG. 2, the alignment mark 122 may include four alignment marks respectively disposed in the vicinity of the four corners. However, the number of alignment marks is not limited thereto, and more than four alignment marks may be provided.

According to the exemplary embodiment of the present invention, the plurality of alignment marks 122 may be rotationally symmetrical to each other with reference to a center 124 of the substrate 120.

Accordingly, locations of the alignment marks 122 may be recognized to be the same even after the substrate 120 may be rotated about a predetermined angle with respect to the center 124 of the substrate 120.

For example, referring to FIG. 2, the four alignment marks 122 may be arranged in the shape of a square so as to be rotationally symmetrical to each other with reference to the center 124 of the substrate 120, and in this case, when the substrate 120 may be rotated about 90 degrees with reference to the center 124 of the substrate 120, the locations of the four alignment marks 122 may be the same.

Thus, the locations of the alignment marks 122 recognized by the location recognition unit 160 may be always the same without regard to whether or not the substrate 120 may be rotated.

In this case, according to the exemplary embodiment of the present invention, the shape of each alignment mark 122 may be rotationally symmetrical.

For example, referring to FIG. 3, the alignment mark 122 may be formed in the shape of a cross of which the vertical length and the horizontal length are equivalent to each other.

In addition, the alignment mark 122 may be formed in the shape of a circle that may be also rotationally symmetrical, and the circular-shaped alignment mark 122 may form a constant pattern so as to correspond to a rotation angle unit of the substrate 120.

Accordingly, the plurality of alignment marks 122 arranged on the substrate 120 in the rotationally symmetrical manner can constantly maintain the shape of each alignment mark 122 even though they rotate about a predetermined angle, for example, 90 degrees.

As described, in the printing apparatus 100 according to the exemplary embodiment of the present invention, the four rotationally symmetrical shaped alignment marks 122 are arranged in the rotationally symmetrical shape with respect to the center 124 of the substrate 120, for example, they are arranged in the shape of the square so that the locations of the alignment marks 122 can be constantly maintained even though the substrate 120 rotates about 90 degrees.

Thus, even though the vertical and horizontal alignments of the substrate 120 are changed as the alignment of the unit cells formed in the substrate 120 may be changed and thus the substrate 120 may be mounted to the stage 140 of the printing apparatus 100 after being rotated by 90 degrees, the alignment of the substrate 120 can be constantly and simply performed without changing equipment or a process for alignment of the substrate 120.

Meanwhile, the above-stated alignment mark 122 can be photographed by a camera 162.

That is, the camera 162 may be formed to photograph the alignment mark 122 formed in the substrate 120, and according to the exemplary embodiment of the present invention, the camera 162 may be disposed to correspond to the alignment mark 122 aligned in the substrate 120 while the substrate 120 may be mounted to the stage 140.

In this case, the camera 162 may be disposed in an upper portion of the stage 140, and also may be fixed to a predetermined location.

In this case, according to the exemplary embodiment of the present invention, the camera 162 may include at least two cameras.

In further detail, referring to FIG. 5, the camera 162 may be formed of two (2) cameras, and the two cameras 162 may be respectively disposed in the upper portions of the alignment marks 122 to photograph the corresponding alignment marks 122.

As described, information of the alignment mark 122 photographed by the camera 162 can be transmitted to the operation device 164.

The operation device 164 may be formed to recognize a coordinate of the alignment mark 122, photographed by the camera 162.

In this case, according to the exemplary embodiment of the present invention, the operation device 164 may be a computer device, and can receive information photographed by the camera 162.

According to the exemplary embodiment of the present invention, the operation device 164 can recognize an x and y coordinate of a center point of at least two alignment marks 122.

Accordingly, a location of the substrate 120 mounted on the stage 140 can be accurately digitized.

As described, location information of the substrate 120 recognized by the location recognition unit 160 can be transmitted to the controller 150.

That is, the controller 150 may be formed to control a location of the substrate 120 based on the location information of the substrate 120 recognized by the location recognition unit 160, that is, location information of the substrate 120 through coordinate data of the alignment 122 aligned in the substrate 120.

Accordingly, referring to FIG. 5, the controller 150 may be connected with the operation device 164 of the location recognition unit 160.

In this case, the controller 150 compares the coordinate data of the alignment mark 122 transmitted from the operation device 164 with a predetermined reference coordinate to determine whether the substrate 120 mounted on the stage 140 may be aligned.

In addition, according to the exemplary embodiment of the present invention, the controller 150 may be connected with the stage 140.

Accordingly, when the substrate 120 mounted on the stage 140 may be inaccurately aligned, the controller 150 can transmit a control signal to the stage 140 to control the alignment of the substrate 120 through a control means provided in the stage 140.

After the substrate 120 is aligned through such a process, the printing apparatus 100 according to the exemplary embodiment of the present invention can perform a printing work on the substrate 120 through the printing unit 180. The printing unit 180 will now be described in further detail.

The printing unit 180 may be a part that performs a printing work by coating a printing solution on the substrate 120 fixed on the stage 140, and referring to FIG. 1, the printing head 182 may be formed to be movable in two axis that are perpendicular to each other, that is, the x-axis and the y-axis.

Accordingly, according to the exemplary embodiment of the present invention, as shown in FIG. 6, the printing unit 180 may include the printing head 182 and a moving frame 184.

The printing head 182 may be a part that drops the printing solution on the substrate 120 that may be fixed to the stage 140, and may be provided with a nozzle (not shown) that can drops the printing solution. In this case, the nozzle may be provided in plural.

In this case, according to the exemplary embodiment of the present invention, the printing head 182 can be formed to be movable to at least two axis directions perpendicular to each other, for example, referring to FIG. 1, FIG. 6, and FIG. 7, the x-axis and the y-axis, by the moving frame 184.

That is, the moving frame 184 may be a part that enables the printing head 182 to move to at least the two axis directions that are perpendicular to each other, and referring to FIG. 6, the moving frame 184 may include a frame member 185 and a moving member 186.

According to the exemplary embodiment of the present invention, the frame member 185 may be formed to be movable to the y-axis in an upper portion of the stage 140, and the moving member 186 may be formed to be movable to the x-axis direction that may be perpendicular to the y-axis direction in one side of the frame member 185.

In this case, the x-axis and the y-axis directions refer to the FIG. 1 and FIG. 7, and will be the same in the following description.

In this case, the printing head 182 may be provided in one side of the moving member 186.

Thus, the printing head 182 can be move to the x-axis direction as the moving member 186 may be moved while being supported by the frame member 185 and can be moved to the y-axis direction as the frame member 185 may be moved by while being supported by the stage 140.

However, the structure of the printing unit 180 is not limited thereto, and any structure that enables the printing head 182 to move to at least two axis directions is applicable.

As described above, the printing apparatus 100 according to the exemplary embodiment of the present invention performs the printing process through the printing head 182 that may be movable to the at least two axis directions as follows. First, the printing head 182 coats the printing solution on the substrate 120 while moving to one axis direction, for example, the y-axis direction.

In this case, when the printing along the y-axis direction is finished, the printing solution can be coated on the substrate 120 while the printing head 182 is moving by a predetermined distance to the x-axis direction and then moving back to the y-axis direction.

Through repetition of such a process, the printing apparatus according to the exemplary embodiment of the present invention performs the printing work.

As described above, the printing apparatus 100 according to the exemplary embodiment of the present invention can recognize the location of the substrate 120 and align the substrate 120 through the same equipment and process without regard to vertical and horizontal alignment of the substrate 120 which may be a printing target.

In this case, the plurality of alignment marks 122 disposed in the substrate 120 of the printing apparatus 100 according to the exemplary embodiment of the present invention are disposed to be rotationally symmetrical with each other with reference to the center 124 of the substrate 120 so that the location of the substrate 120 can be recognized using the same photographing device and the same method without regard to whether or not the substrate 120 may be rotated, and accordingly, the alignment process can be simply performed on the printing apparatus 100 without change or control of the equipment and process.

Accordingly, the printing apparatus 100 according to the exemplary embodiment of the present invention can effectively perform the printing work on the substrate 120 of which alignment may be varied.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A printing apparatus in combination with a substrate recognizing a location of the substrate in which a plurality of alignment marks are formed, comprising:
    a stage to which the substrate is mounted;
    a location recognition unit recognizing a location of the substrate mounted to the stage; and
    a printing unit disposed in an upper portion of the stage and coating a printing solution on the substrate,
    wherein the location recognition unit comprises,
    a camera photographing the alignment marks, and
    wherein each of said plurality of alignment marks has eight separate segments in a circular shape that is rotationally symmetrical and maintains the same visual shape no matter what angle the alignment mark is viewed from, and
    the plurality of alignment marks are disposed to be rotationally symmetrical to each other with reference to the center of the substrate for the locations of the alignment marks to be the same even though the substrate is rotated by a predetermined angle with reference to the center of the substrate.

2. The printing apparatus of claim 1, wherein the alignment marks include at least four alignment marks, and the at least four alignment marks are rotationally symmetrical for every 90 degree angle.

3. The printing apparatus of claim 2, wherein the at least four alignment marks are disposed in the shape of a square.

4. The printing apparatus of claim 1, wherein each of the alignment marks is rotationally symmetric.

5. The printing apparatus of claim 1, wherein the location recognition unit further comprises an operation device that recognizes a coordinate of the alignment mark photographed by the camera.

6. The printing apparatus of claim 1, wherein the camera comprises at least two cameras.

7. The printing apparatus of claim 6, wherein the at least two cameras are disposed in a fixed manner so as to correspond to the locations of the alignment marks.

8. The priming apparatus of claim 1, wherein the printing unit, comprises:
    a priming head dropping the printing solution on the substrate; and
    a moving frame in which the printing head is provided movable to at least two axis directions.

9. The printing apparatus of claim 8, wherein the moving frame, comprises:
    a frame member provided movable to as first axis direction in an upper portion of the stage; and
    a moving member provided movable to a second axis direction that is perpendicular to the first axis direction in the frame member,
    wherein the printing head is provided in one side of the moving member.

10. The printing apparatus of claim 1, further comprising:
    a controller controlling a location of the substrate through information recognized by the location recognition unit.

11. A printing apparatus in combination with a substrate for printing a plurality of unit cells on the substrate in which a plurality of alignment marks formed, comprising:
    a printing unit that prints a pattern onto each unit cell of said plurality of unit cells of said substrate, said pattern may be identical or different from one unit cell to another;
    a moving frame to which the printing unit is attached that moves the printing head in at least two different axis directions; and
    a location recognition unit to recognize a location of the substrate, said location recognition unit comprises:
        a plurality of cameras photographing the alignment marks,
    wherein each of said plurality of alignment marks has eight separate segments in a circular shape that is rotationally symmetrical and maintains the same visual shape no matter what angel the alignment mark is viewed from, and
    the plurality of alignment marks are disposed to be rotationally symmetrical to each other with reference to the center of the substrate for the locations of the alignment marks to be the same even though the substrate is rotated by a predetermined angle with reference to the center of the substrate.

12. The printing apparatus of claim 11, wherein the alignment marks include at least four alignment marks, and the at least four alignment marks are rotationally symmetrical for every 90 degree angle.

13. The printing apparatus of claim 12, wherein the at least four alignment marks are disposed in the shape of a square.

14. The printing apparatus of claim 11, wherein each of the alignment marks is rotationally symmetric.

15. The printing, apparatus of claim 11, wherein the location recognition unit further comprises an operation device that recognizes a coordinate of the alignment mark photographed by the camera.

16. The printing apparatus of claim 11, wherein the plurality of cameras is two cameras.

17. The printing apparatus of claim 16, wherein the two cameras are disposed in a fixed manner so as to correspond to the locations of the alignment marks.

18. The printing apparatus of claim 11, wherein the printing unit comprises
    a printing head dropping the printing solution on the substrate; and
    the moving frame in which the printing head is provided movable to at least two axis directions.

19. The printing apparatus of claim 18, wherein the moving frame, comprises:
    a frame member provided movable to a first axis direction in an upper portion of the stage; and
    a moving member provided movable to a second axis direction that is perpendicular to the first axis direction in the frame member,
    wherein the printing head is provided in one side of the moving member.

20. The printing apparatus of claim 11, further comprising:
    a controller controlling a location of the substrate through information recognized by the location recognition unit.

* * * * *